United States Patent
Chih

(10) Patent No.: US 11,373,706 B2
(45) Date of Patent: Jun. 28, 2022

(54) MEMORY CIRCUIT, METHOD, AND ELECTRONIC DEVICE FOR IMPLEMENTING TERNARY WEIGHT OF NEURAL CELL NETWORK

(71) Applicant: Taiwan Semiconductor Manufacturing Company, Ltd., Hsinchu (TW)

(72) Inventor: Yu-Der Chih, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 38 days.

(21) Appl. No.: 17/105,483

(22) Filed: Nov. 25, 2020

(65) Prior Publication Data
US 2022/0165334 A1    May 26, 2022

(51) Int. Cl.
*G11C 11/00* (2006.01)
*G11C 13/00* (2006.01)

(52) U.S. Cl.
CPC ........ *G11C 13/004* (2013.01); *G11C 13/0069* (2013.01); *G11C 2013/0042* (2013.01); *G11C 2013/0054* (2013.01)

(58) Field of Classification Search
CPC .............. G11C 13/004; G11C 13/0069; G11C 13/0042; G11C 13/0054
USPC ......................................................... 365/148
See application file for complete search history.

(56) References Cited

U.S. PATENT DOCUMENTS

| 2020/0279176 A1* | 9/2020 | Hatcher | G11C 11/1675 |
| 2020/0301668 A1* | 9/2020 | Li | G11C 11/54 |

* cited by examiner

*Primary Examiner* — Vu A Le
(74) *Attorney, Agent, or Firm* — JCIPRNET

(57) ABSTRACT

The disclosure is directed to a memory circuit, an electronic device, and a method for implementing a ternary weight for in-memory computing. According to an aspect of the disclosure, the memory circuit includes a first memory cell having a first resistor; a second memory cell having a second resistor, a write driver configured to set the first resistor to a first resistance value, a second write driver configured to set the second resistor to a second resistance value, a differential current sensing circuit configured to determine a differential current between the first memory cell and the second memory cell based on the first resistance value and the second resistance value, and a ternary weight detector configured to determine a ternary weight which is selected among a first ternary weight, a second ternary weight, and a third ternary weight based on the differential current.

20 Claims, 10 Drawing Sheets

MEMORY CIRCUIT, METHOD, AND ELECTRONIC DEVICE FOR IMPLEMENTING TERNARY WEIGHT OF NEURAL CELL NETWORK

BACKGROUND

Conventionally, computations are performed by a central processor (CPU). In order to improve computational speeds into a higher level, the technology of 'In-memory Computing' has utilized leading to a significant improvement of computing speed and will be a trend in the near future. In-memory Computing refers to a technique which performs computations within a memory device itself without transmitting data to the CPU for computing and may lead to a greater computing speed and causes a significant improvement in the era where a significant amount of data is prevalent. One technique used to implement In-memory Computing is adopt the Convolutional Neural Network (CNN) or Deep neural Network (DNN) into the field of computer memory design. According, how to implement CNN or DDN within a computer memory has been hot topic for persons of ordinary skill in the art.

Within the field of CNN or DNN, one implementation of a weight is to use the electrical circuit of a memory cell. For example, the conduction time of word line could be considered as input, and the bit stored in a cell may correspond to a weight. Over time, the weight, the current of the bit line, an output of the cell(s) could be obtained as a matter of performing a vector matrix multiplication. Referring to FIG. 1 which shows a conceptual diagram of a memory cell for implementing a weight. The Input $X_i$ is the voltage applied on a bit line, and $X_i$ is associated a time period or a duration of the voltage applied on the bit line. $W_{ij}$ is a data bit stored in a cell or among the cells, and the value of the data bit could be obtained based on the current from the cell.

For example, if the cell corresponds to a high resistance, the current would be low. If the current is low then, the data bit could be considered as representing a '0'. On the contrary, if the cell corresponds to a high resistance, the current would be high. If the current is high, and the data bit would be considered as representing '1'. The output then could be determined according to the sum of all products of $X_i$ and $W_{ij}$, which can be represented as: $Y_j=\Sigma_i X_i W_{ij}$. To be specific, product of $X_i$ and $W_{ij}$ would refer to a charge (product of time and current) which could then be converted to pulse width and then outputted as a digital value accordingly.

However, to implement a weight of a neural network by using a memory circuit, one conventional concept is to use one binary weight per cell to implement near memory computing. Under this scheme, a memory circuit may contain a plurality of cells, and each of the plurality of cells could be used as temporary or permanent a storage for storing the binary weight of a neural network. A sense amplifier could be connected to one or more of the cells and configured to read out the binary weight stored in each of the cells. For instance, assuming that there two resistive cells, RL and RH. The RL cell may store a weight of the binary value of 1 while the RL cell may store a weight of the binary value of 0. After accessing the weight of the memory cells according to a predetermined sequence (N bits per cycle), the weights for a neural network operation could be obtained.

The plurality of cells of the memory circuits could be configured as a matrix of multiple rows and columns. Each row would be connected to a different word line, and each word line could be connected to a digital to analog converter (DAC) which would output a signal for activating each row. Each column would be connected to a different bit line which could be connected to an analog to digital converter (ADC). The weight at each address location (i.e. weight at $i^{th}$ row and $j^{th}$ column ($W_{ij}$)) could be based on the charges of an electrical current at the memory cell, and the charges of the electrical current of at the memory location may consequently be converted into a digital value which represents the binary weight of the memory cell.

However, the data bit of a memory cell would be a binary number representing a '0' or a '1'. It can't simulate situations during learning, for example, situations involving 'yes', 'no' and a third possibility such as 'maybe'. Accordingly, two bits could be needed to implement the binary weight of the CCN or DNN. Thus, the binary implementations of a weight may lead to slow computations and overheating of the memory device.

Alternatively, a ternary weight system could be used to represent a weight of a neural network for in-memory computing. A ternary weight network (TWN) refers to a neural network having weights constrained to +1, 0 and −1 as the Euclidian distance between full precision weights and the ternary weights along with a scaling factor has been minimized. A threshold based ternary function could be optimized to get an approximated solution which could lead to fast and easy computations. A TWN may have stronger expressive abilities than the recently proposed binary precision counterparts and are thus more effective than the latter. A TWN may achieve a high level of model compression rate and would likely need fewer multiplications in comparison with the full precision counterparts. Overall, a neural network with the ternary weight implementation would likely achieve better accuracy in comparison to a binary-weight neural network.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
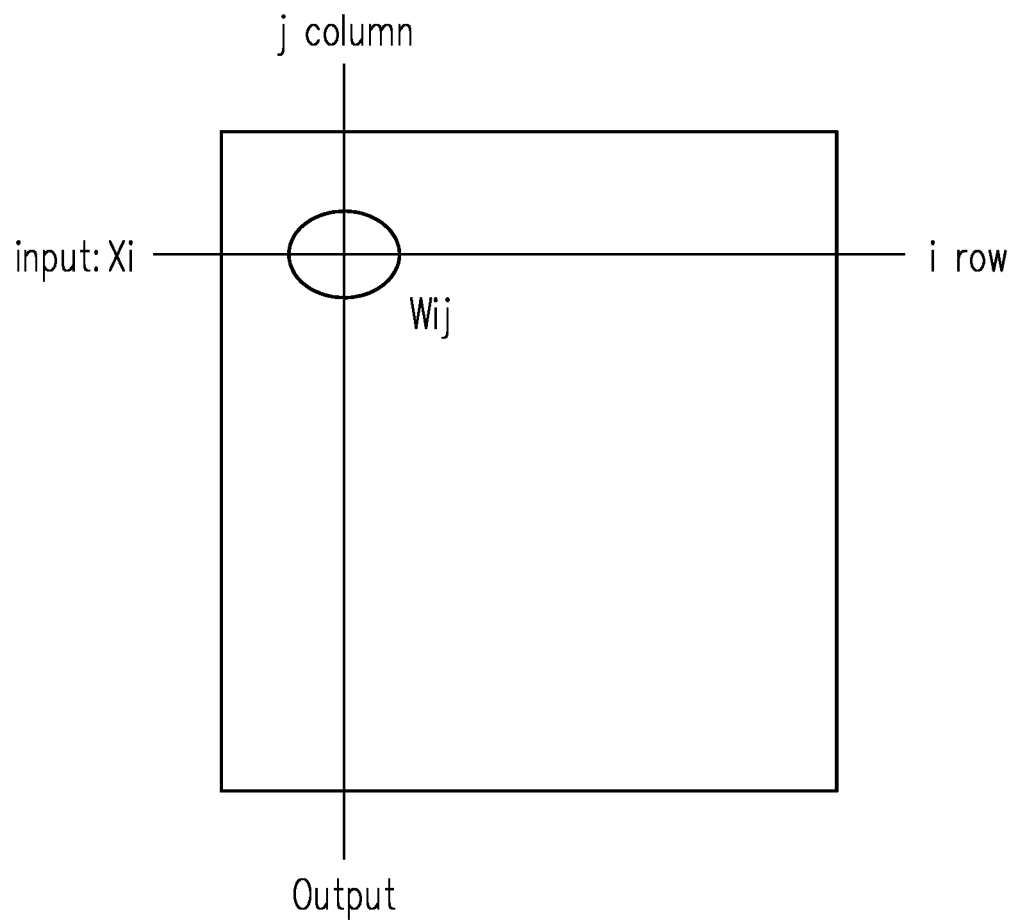
FIG. 1 illustrates a conceptual diagram of a memory cell for implementing a ternary weight.

Reference will now be made in detail to the present exemplary embodiments of the disclosure, examples of which are illustrated in the accompanying drawings. Wherever possible, the same reference numbers are used in the drawings and the description to refer to the same or like parts.

The disclosure provides a mechanism for a memory device to set a ternary weight of a neural network so as to improve the performance of in-memory computing. This disclosure utilizes multiple (e.g. dual) memory cells to implement one ternary weight by setting cell resistances to generate a differential current between two of the memory cells. The differential current could then by measured against different reference currents to obtain the ternary weight.

In this disclosure, when a memory cell resistance is set to a high resistance, the resistance would be higher than a resistance threshold. Specifically, this resistance threshold could be higher than a high resistance which would restrict the current flow. In this way, it would not be necessary to fine tune the memory cell resistances and thus the cost of manufacturing a memory device could be reduced accordingly.

This disclosure could be implemented in a memory device such as resistive random-access memory (RRAM), flash memory, and the like by using two cells to represent one ternary weight. The two cells of one ternary weight could be implemented in different ways. For example, two memory cells could be connected in tandem on the same bit line (BL) and are located on the left side and right side of the BL but connected to two different word lines (WLs). Alternatively, the two memory cells could be connected to two different bit lines (BLs) but the same word line (WL). Both cells may share the same sense amplifier which is used to determine and transmit stored data signal to a ternary weight detecting circuit which detects the value of the ternary weight.

Each memory cell may contain at least one resistor which could be set by a driver during a write operation. Assuming that there are two resistors, $R_1$ and $R_2$, in each of the two cells, $R_1$ could be set low and $R_2$ could be set high to generate a positive differential current across the two cells. $R_1$ could be set high and $R_2$ could be set low to generate a negative differential current across the two cells. Both $R_1$ and $R_2$ could be set high to generate approximately zero differential current across the two cells. Specifically, when a resistor is set as a high resistance, the resistance is higher than a threshold (RUH). The threshold is higher than a high resistance used by an ordinary person skilled in the art. For instance, a high resistance could be greater than 10 k ohm and a low resistance could be less than 1 k ohm. Therefore, for example, to generate a positive differential current across the two cells, $R_1$ could be less than 1K ohm and $R_2$ could be greater than 10 k ohm, to generate a negative differential current across the two cells, $R_1$ could be greater than 10K ohm and $R_2$ could be less than 1 k ohm, and to generate zero differential current or a very negligible amount of differential current, both $R_1$ and $R_2$ could be greater than 10 k. However, the disclosure does not limit to these exact numbers, and the values of the resistances do not have to be exact.

Table 1A below shows the relationships between the resistances, the differential reference current, and the resulting state (i.e. ternary weight values). As shown in Table 1A, if the differential current is greater than a positive reference current, than the resulting state could be translated by an additional circuit to be +1, if the differential current is determined to be zero or negligible, then the resulting state could be translated by an additional circuit to be 0, and if the differential current is determined to be less than a negative reference current, then the resulting state could be translated by an additional circuit to be −1.

TABLE 1A

| State | R1 | R2 | ΔI |
|---|---|---|---|
| +1 | RL | $R_H$ | $>+I_{REF}$ |
| 0 | $>R_{UH}$ | $>R_{UH}$ | ~0 |
| −1 | $R_H$ | $R_L$ | $<-I_{REF}$ |

The working principle is further elucidated as follows. The states are determined according to the current difference of right cell and left cell, which can be represented according to Equation 1.

$$\Delta I = \frac{V}{R_1} - \frac{V}{R_2} \qquad \text{Equation 1}$$

For Equation 1, ΔI stands for the differential current, $R_1$ stands for the resistance of the first cell, $R_2$ stands for the resistance of the second cell, and V stands for the BL voltage. If the two cells are connected to different BLs, the BL voltages of the two BLs could be the same.

For example, assuming that the two cells are located in tandem on the same bit line (BL) and are located on the left side and right side of the BL, then for the state "+1", the right cell is set as low resistance and the left cell is set as high resistance. In this way, the current of the left cell ($I_L$) is higher than the current of the right cell ($I_R$) since the resistance of the left cell ($R_L$) is much higher. Thus, it can be determined that ΔI is greater than 0. For the state "−1", the right cell is set as high resistance and the left cell is set as low resistance. Accordingly, the $I_R$ is higher than $I_L$ since the resistance of the right cell ($R_R$) is much higher. Thus, it can be determined that ΔI is smaller than 0. Here, the high resistance is higher than a threshold, but the invention is not limited thereto. For the state "0", the high resistance is higher than a threshold ($R_{UH}$), and thus both $R_L$ and $R_H$ would be very high. However, the advantage of the disclosure is that regardless of $I_R$ and $I_L$ are similar or very dissimilar, since $I_R$ and $I_L$ are both very small, then the ΔI is almost "0".

Figure 2:
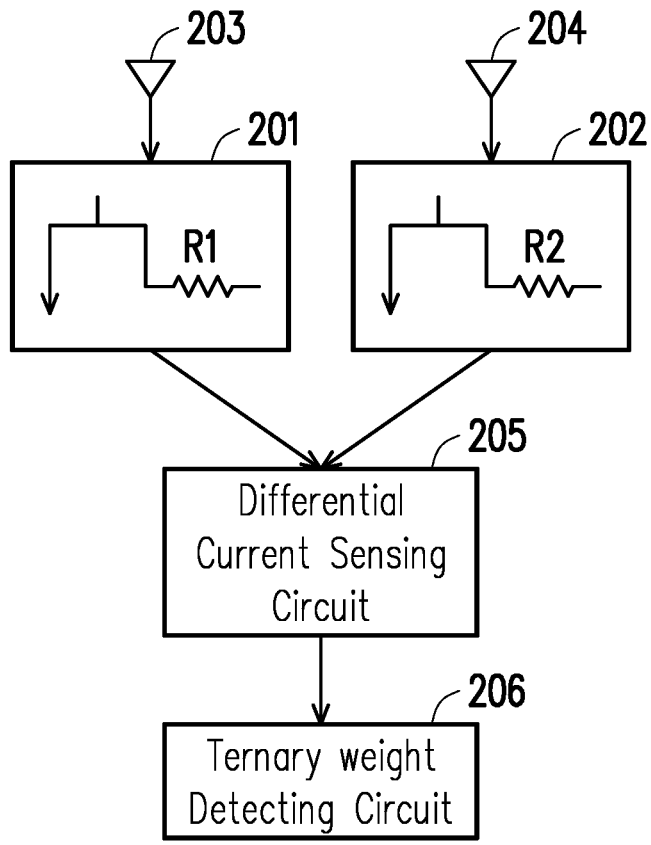
FIG. 2 illustrates the hardware diagram of a memory device for implementing a ternary weight according to an exemplary embodiment of the disclosure.

In order to realize the above described concepts, the disclosure provides a memory circuit and a corresponding method used by the memory circuit to represent a ternary weight for in-memory computing. FIG. 2 shows the hardware diagram of a memory circuit 200 for representing a ternary weight according to an exemplary embodiment of the disclosure. The memory circuit 200 could be included within a memory device such as a RRAM or flash memory device, or any similar memory device. The memory device could be included within an electronic device which contains not limited to a central processing unit (CPU), a memory controller, and the memory device. The memory device could be connected to the memory controller which is connected to the CPU of the electronic device.

Referring to FIG. 2, the memory circuit 200 would include not limited to a first memory cell 201 having a first resistor R1, a second memory cell 202 having a second resistor R2, a write driver 203 configured to set the first resistor R1 to a first resistance value, a second write driver 204 configured to set the second resistor R2 to a second resistance value, a differential current sensing circuit 205 configured to determine the differential current between the first memory cell 201 and the second memory cell 202 based on the first resistance value and the second resistance value, and a ternary weight detector 206 configured to determine a ternary weight which is selected among a first ternary weight, a second ternary weight, and a third ternary weight based on the differential current.

The first resistance value could be set to a low value and the second resistance value could be set to a high value for the first ternary weight (+1), the first resistance value could be set to the high value and the second resistance value could be set to the high value for the second ternary weight (0), and the first resistance value could be set to the high value and the second resistance value could be set to the low value for the third ternary weight (−1). The low value could be any positive resistance value below a low resistance threshold, and the high value could be any positive resistance value above a high resistance threshold. The differential current sensing circuit 205 could be configured to output a differential current according to a summation of a first current from the first memory cell and a second current of the second memory cell.

The ternary weight detecting circuit 206 could be configured to determine the differential current as corresponding to the first ternary weight (+1) when the differential current is above a positive current threshold, the differential current detector is configured to determine the differential current as corresponding to the second ternary weight (0) when the differential current is between the positive current threshold and a negative current threshold, and the differential current detector is configured to determine the differential current as corresponding to the third ternary weight (−1) when the differential current is below the negative current threshold.

The differential current sensing circuit 205 could be configured to detect the differential current based on a current difference between a first ratio of a voltage of the WL and the first resistance and a second ratio of the voltage of the WL and the second resistance. The differential current sensing circuit 205 could be implemented by using a current comparator which compares the differential current with a reference current.

The first memory cell 201 could be connected to a first BL, the second memory cell 202 could be connected to a second BL, while the first memory cell 201 and the second memory cell 202 could be connected to the same WL. Alternatively, the first memory cell 201 and the second memory cell 202 could be connected to the same BL, the first memory cell could be connected to a first WL, and the second memory cell could be connected to a second WL.

Figure 3:
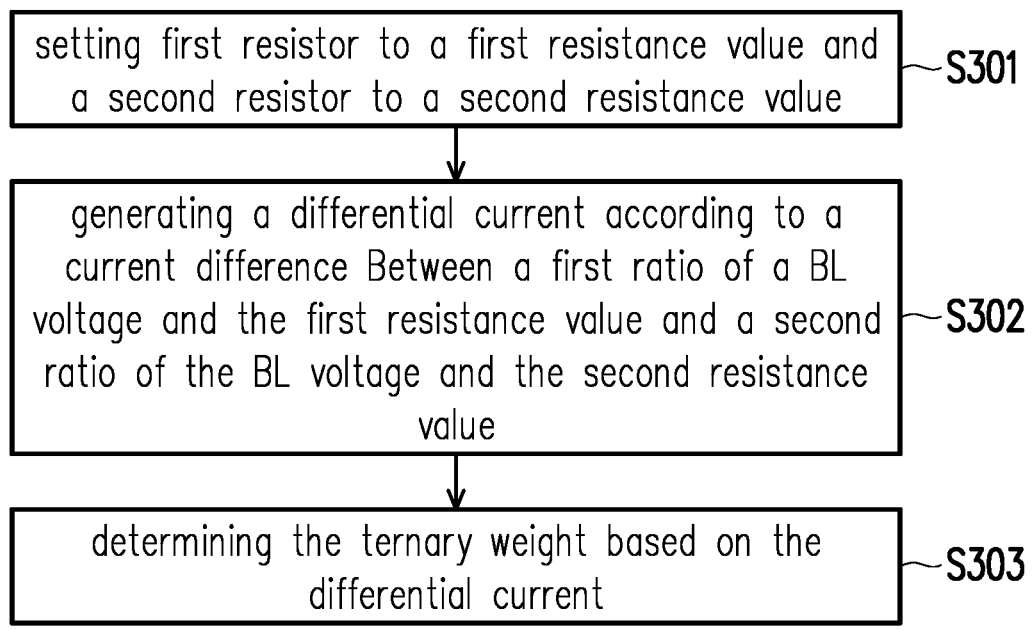
FIG. 3 illustrates the method used by a memory device for implementing a ternary weight according to an exemplary embodiment of the disclosure.

FIG. 3 illustrates the method used by the memory circuit 200 for representing a ternary weight. In step S301, the memory circuit 200 would set a first resistor of a first memory cell to a first resistance value and a second resistor of a second memory cell to a second resistance value where the first resistance value is a low value and the second resistance is a high value for the first ternary weight, first resistance value is the high value and the second resistance is the high value for the second ternary weight, and first resistance value is the high value and the second resistance is the low value for the third ternary weight. In step S302, the memory circuit 200 would generate a differential current according to a current difference between a first ratio of a BL voltage and the first resistance value and a second ratio of the BL voltage and the second resistance value. In step S303, the memory circuit 200 would determine the ternary weight based on the differential current.

Figure 4:
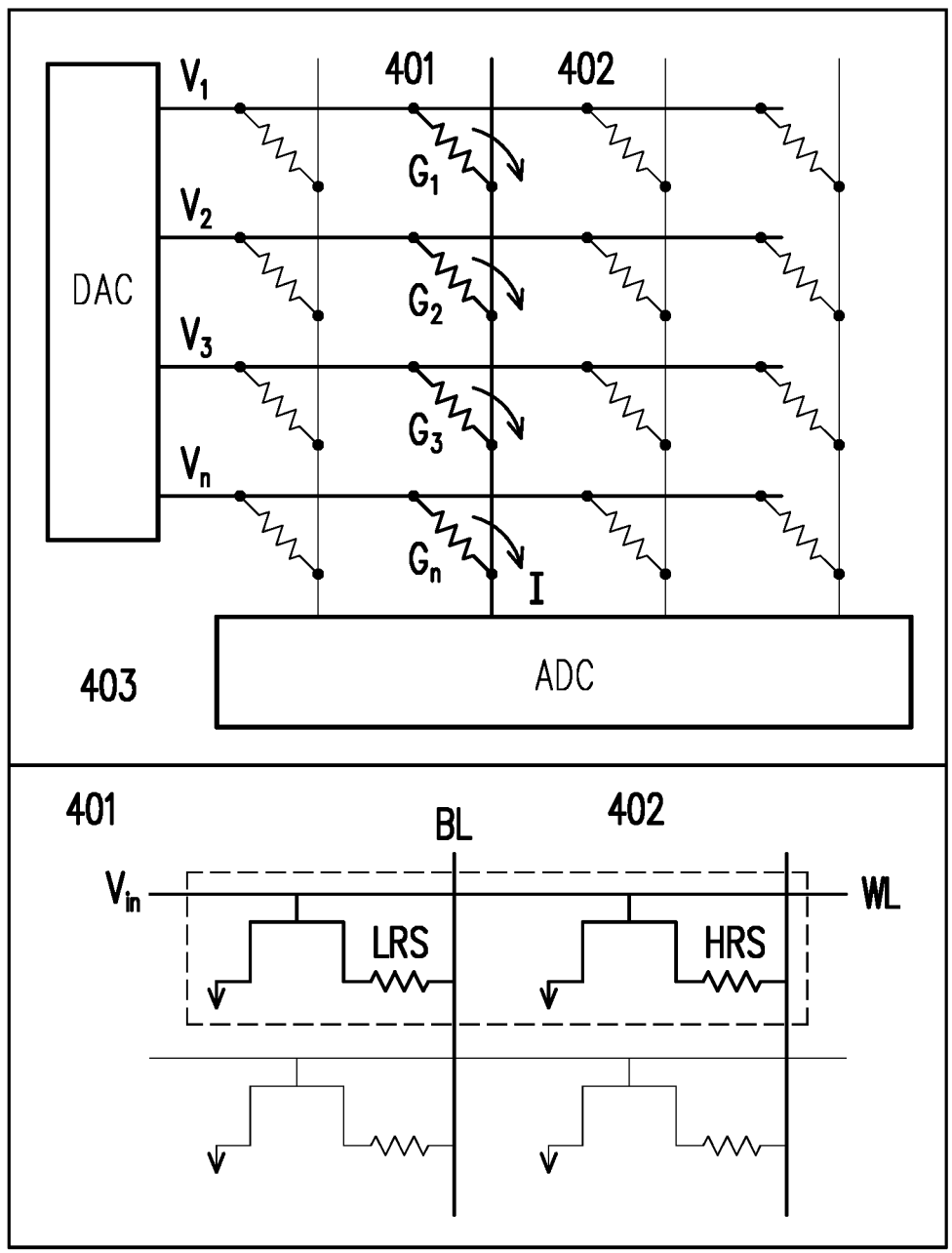
FIG. 4 illustrates a RRAM device for implementing a DNN according to a first exemplary embodiment of the disclosure.

In order to further elucidate the principle of operation of the memory circuit 200, the disclosure provides various exemplary embodiments as shown in FIG. 4~ FIG. 10. FIG. 4 illustrates a RRAM device 400 for implementing a DNN according to a first exemplary embodiment of the disclosure. For this exemplary embodiment, the RRAM device 400 has a plurality of memory cells with each cell symbolized by the resistor symbol of FIG. 4. Two of the memory cells would be used to represent a cell of a neural network, and each cell of a neural network outputs a ternary weight. For instance, the first memory cell 401 and the second memory cell 402 which are located side by side could be used to represent one ternary weight. The first memory cell 401 contains a first resistor LRS and the second memory cell 402 contains a second resistor HRS. It has been well known that such resistor (e.g. LRS, HRS) of a RRAM device could be set during a write operation. Thus, the first resistor LRS and the second resistor HRS could be set during a write operation according to Equation 1 so as for the cell to have a ternary weight.

A differential current could be generated by the first memory cell 401 and the second memory cell 402 and detected by a differential current sensing circuit (e.g. 205, not shown in FIG. 4). In this example, the differential current would be $$\Delta I = \frac{V}{R_{LRS}} - \frac{V}{R_{HRS}}$$

where the voltage would be the BL voltage which could be the same for the BLs that respectively connect to LRS and HRS. After the differential current has been generated, the ternary weight could be determined by the ternary weight detecting circuit (e.g. 206) based on Table 1A. Alternatively, the ternary weight could be determined digitally. For instance, the currents from the first resistor LRS and the second resistor HRS may each be converted into voltages and subsequently converted into a digital signal by an analog-to-digital converter (ADC) 403. The differential current may then be determined according to Equation 1 and the ternary weight could be determined according to Table 1A. Alternatively, the differential current could be determined by using a differential current sensing circuit (e.g. 205) to determine the differential current which may then be converted into a differential voltage and subsequently a digital form by using the ADC 403. The ternary weight could then be determined digitally according to Table 1A.

Figure 5:
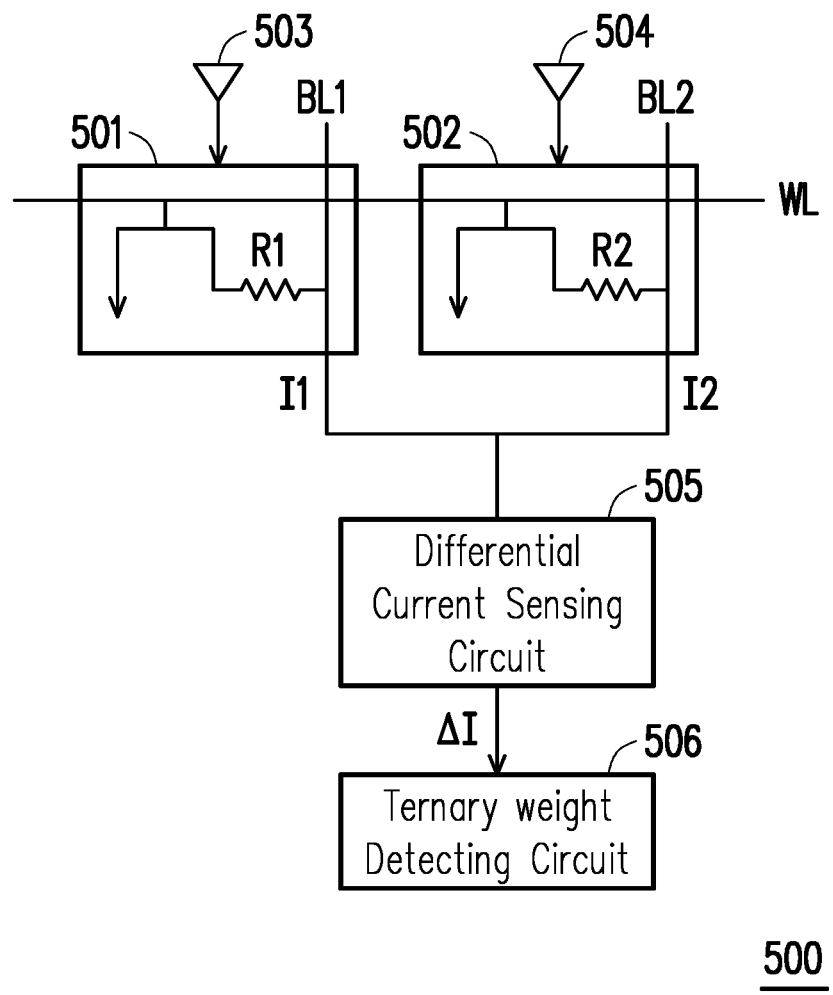
FIG. 5 illustrates a hardware diagram of a RRAM device for implementing a DNN according to a second exemplary embodiment of the disclosure.

FIG. 5 illustrates a hardware block diagram of a RRAM device 500 for implementing a DNN according to a second exemplary embodiment of the disclosure. The RRAM device. For this exemplary embodiment, ADCs are not required, and two memory cells are connected side by side on the same row controlled by the same WL but connected to different BLs. The RRAM device 500 contains a plurality of memory cells which include a first memory cell 501 and a second memory cell 502. The first memory cell 501 is controlled by the WL and contains a first resistor R1, and the second memory cell 502 is controlled by the WL and contains a second resistor R2. The first resistor R1 and the second R2 may each be set to a high resistance or a low resistance during a write operation. The high resistance could be any resistance higher than a high resistance threshold, and the low resistance could be any resistance lower than a low resistance threshold. The high resistance threshold could be, for example, 10,000 ohms or 10 k ohms, and the low resistance threshold could be, for example, 1,000 ohms or 1 k ohms.

The first resistance 501 could be set during a write operation by activating the WL and BL1 and by applying a high resistance setting voltage that can set the first resistance 501 to a high resistance or by applying a low resistance setting voltage that can set the first resistance 501 to a low resistance. The same principle would apply for setting the second resistance 502 to either a high resistance or a low resistance. In order to represent one of the three states or one of the three values of a ternary weight, the relationships in Table 1A is to be applied.

The first cell 501 would output a first current $I_1$ and the second cell 502 would output a second current $I_2$. The differential current sensing circuit 505 would receive the first current $I_1$ and the second current I, from the first memory cell 501 and the second memory cell 502 according to Equation 1 to generate a differential current, ΔI. The differential current sensing circuit 505 is currently well known and the thus principle of operation would be apparent to an ordinary person skilled in the art. The differential current, ΔI would be sent to the ternary weight detecting circuit 506 which would then determine a ternary weight based on Table 1A. The ternary weight detecting circuit 506 is to be elaborated upon in latter parts of the disclosure. Additionally, it would be apparent to an ordinary person skilled in the art that the functions of the differential current sensing circuit 505 and the ternary weight detecting circuit 506 be replaced by digital logic circuits or a processor function to achieve the same purpose.

Figure 6:
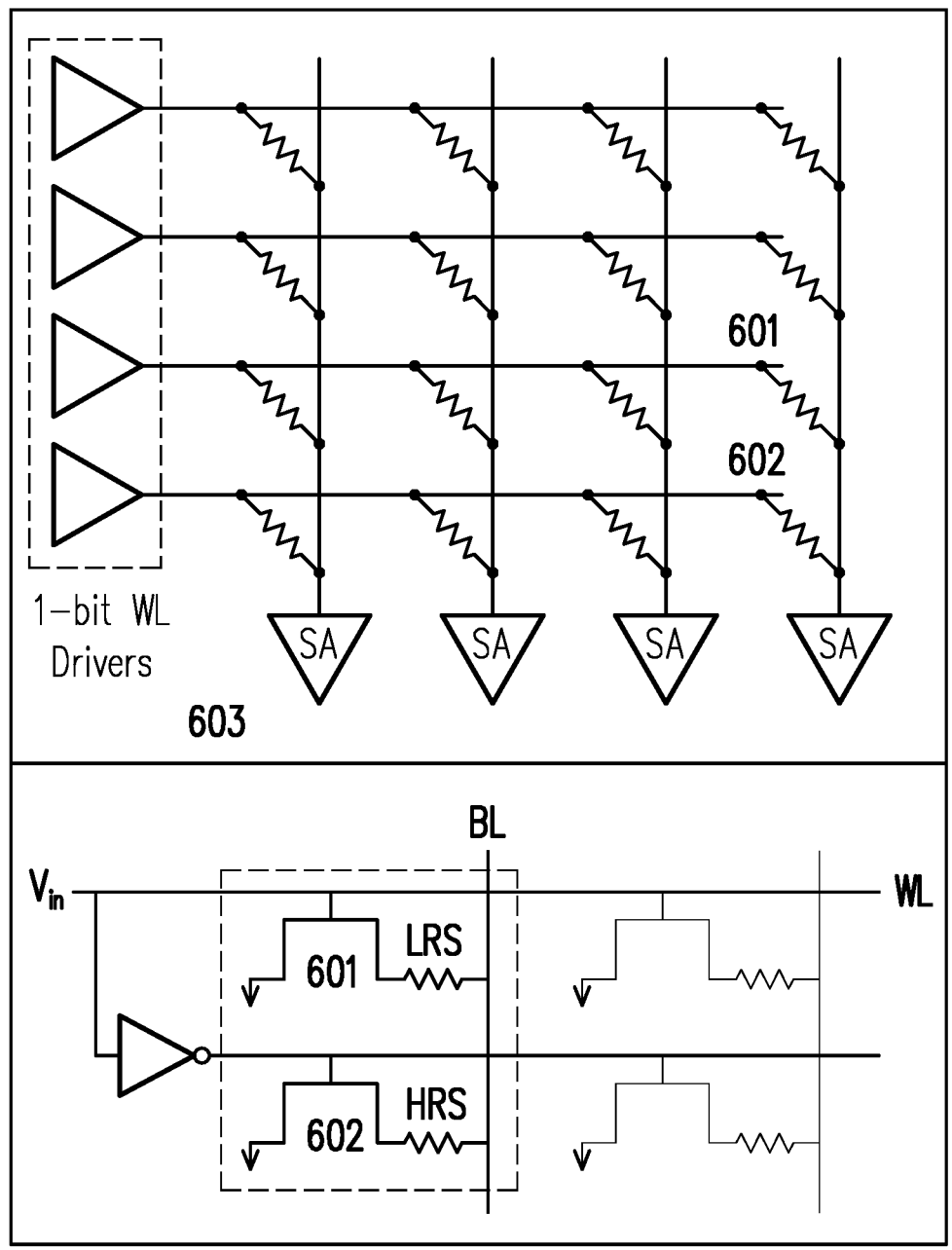
FIG. 6 illustrates a RRAM device for implementing a CNN according to a third exemplary embodiment of the disclosure.

FIG. 6 illustrates a RRAM device for implementing a CNN according to a third exemplary embodiment of the disclosure. For this exemplary embodiment, the RRAM device 600 has a plurality of memory cells with each cell symbolized by the resistor symbol of FIG. 6. Two of the memory cells would be used to represent a cell of a neural network, and each cell of a neural network outputs a ternary weight. Two of the memory cells may connected to the same BL but controlled by different WLs or connected to the same WL but different BLs. Even though FIG. 6 shows one of such alternatively, it would be apparent for an ordinary person skilled the art that a similar concept would be applicable to the other alternative. For the embodiment of FIG. 6, the memory cells are connected to the same BL and the same WL but separated by an inverter which means only one of the memory cells 601 602 would be turned on at a time. Alternatively, the memory cells 601 602 could be connected to different WLs. As shown in FIG. 6, the first memory cell 601 and the second memory cell 602 could be located in different adjacent rows to represent one ternary weight. The first memory cell 601 contains a first resistor LRS and the second memory cell 602 contains a second resistor HRS. Each of the resistors (e.g. LRS, HRS) of the RRAM device is connected to a write driver which may set the resistance values during a write operation. Thus, the first resistor LRS and the second resistor HRS could be set during a write operation according to Equation 1 so as correspond to a particular ternary weight.

A differential current could be detected based on currents from the first memory cell 601 and the second memory cell 602 and detected by the sense amplifier (SA) on a BL 603 which may be modified to function as a differential current sensing circuit (e.g. 205, not shown in FIG. 6) as well as the ternary weight detecting circuit 206. For instance, the WL may first turn on the first memory cell 601 which would output a first current to be detected by the corresponding SA 603, and the first current could be compared against a positive reference current $I_{REF}$ as shown in Table 1A for determining whether the current exceeds the $I_{REF}$. After a time period has elapsed, the WL voltage could be reversed to turn off the first memory cell 601 but turn on the second memory cell 602 which would output a second current to be detected by the corresponding SA 603, and the second current could be compared against a negative reference current $-I_{REF}$ as shown in Table 1A after the reference current has been switched from $I_{REF}$ to $-I_{REF}$ for determining whether the current is less than the $-I_{REF}$. If the first current has exceeded the $I_{REF}$, then the ternary weight is +1, if the second current is below the $-I_{REF}$, then the ternary weight is −1, and if neither the first current exceeds the $I_{REF}$ nor the second current is below $-I_{REF}$, then the ternary weight is 0.

Also, in this example, the differential current would be $$\Delta I = \frac{V}{R_{LRS}} - \frac{V}{R_{HRS}}$$

where the voltage would be the BL voltage. Also, alternatively, the ternary weight could be determined digitally. For instance, the output of the SA 603 could be converted into a digital signal by an analog-to-digital converter (ADC) 403, and then the differential current may then be determined according to Equation 1 and the ternary weight could be determined according to Table 1A.

Figure 7:
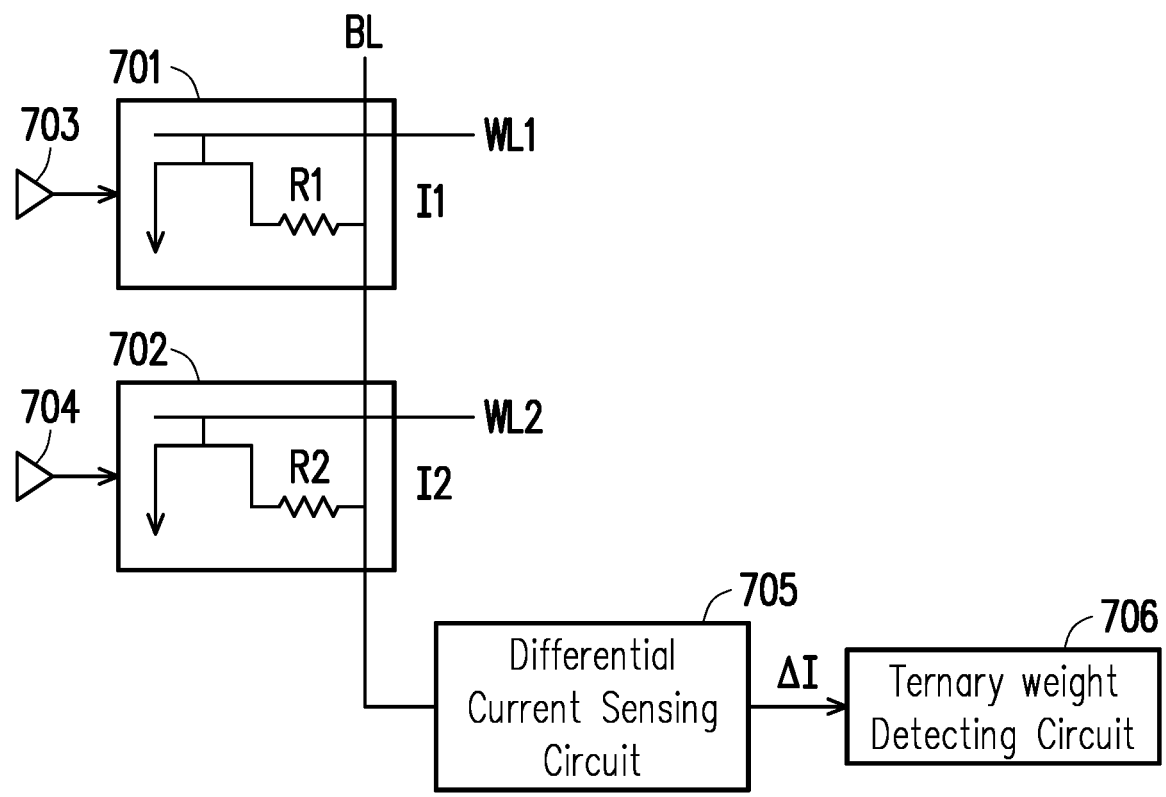
FIG. 7 illustrates a hardware diagram of a RRAM device for implementing a CNN according to a fourth exemplary embodiment of the disclosure.

FIG. 7 illustrates a hardware diagram of a RRAM device for implementing a CNN according to a fourth exemplary embodiment of the disclosure. For this exemplary embodiment, a SA is replaced by a differential current sensing circuit 705 in combination with a ternary weight detecting circuit 706 as described previously. The differential current sensing circuit 705 is connected to a bit line which is shared by two memory cells and the ternary weight detecting circuit 706 is connected to the output of the differential current sensing circuit 705. The two memory cells are connected to the same BL, but they could be controlled either by different WLs or by the same WL separated by an inverter as shown in FIG. 6. The RRAM device 700 contains a plurality of memory cells which include a first memory cell 701 and a second memory cell 702. The first memory cell 701 is controlled by the WL1 and contains a first resistor R1, and the second memory cell 702 is controlled by the WL2 and contains a second resistor R2. The first resistor R1 and the second R2 may each be set to a high resistance or a low resistance during a write operation by their respective write drivers 703 704. The high resistance could be any resistance higher than a high resistance threshold, and the low resistance could be any resistance lower than a low resistance threshold. The high resistance threshold could be, for example, 10,000 ohms or 10 k ohms, and the low resistance threshold could be, for example, 1,000 ohms or 1 k ohms.

Similar to the embodiment of FIG. 5, the first resistance 701 could be set during a write operation by activating the WL1 and the BL and by applying a high resistance setting voltage that can set the first resistance 701 to a high resistance or by applying a low resistance setting voltage that can set the first resistance 701 to a low resistance. The same principle would apply for setting the second resistance 702 to either a high resistance or a low resistance. In order to represent one of the three states or one of the three values of a ternary weight, the relationships in Table 1A is to be applied.

The first cell 701 would output a first current $I_1$ and the second cell 702 would output a second current $I_2$. The differential current sensing circuit 705 would receive and record the first current $I_1$ from the first memory cell 701 by turning on WL1. After a time period, the differential current sensing circuit 705 would receive and record the second current $I_2$ from the second memory cell 702. The differential current sensing circuit 705 would be configured to calculate the differential current ΔI according to Equation 1 based on the first current $I_1$ and the second current 12. The differential current sensing circuit 705 is currently well known and the thus principle of operation would be apparent to an ordinary person skilled in the art. The differential current, ΔI would be sent to the ternary weight detecting circuit 706 which would then determine a ternary weight based on Table 1A. Also, it would be apparent to an ordinary person skilled in the art that the functions of the differential current sensing circuit 705 and the ternary weight detecting circuit 706 be replaced by digital logic circuits or a processor function to achieve the same purpose.

Figure 8:
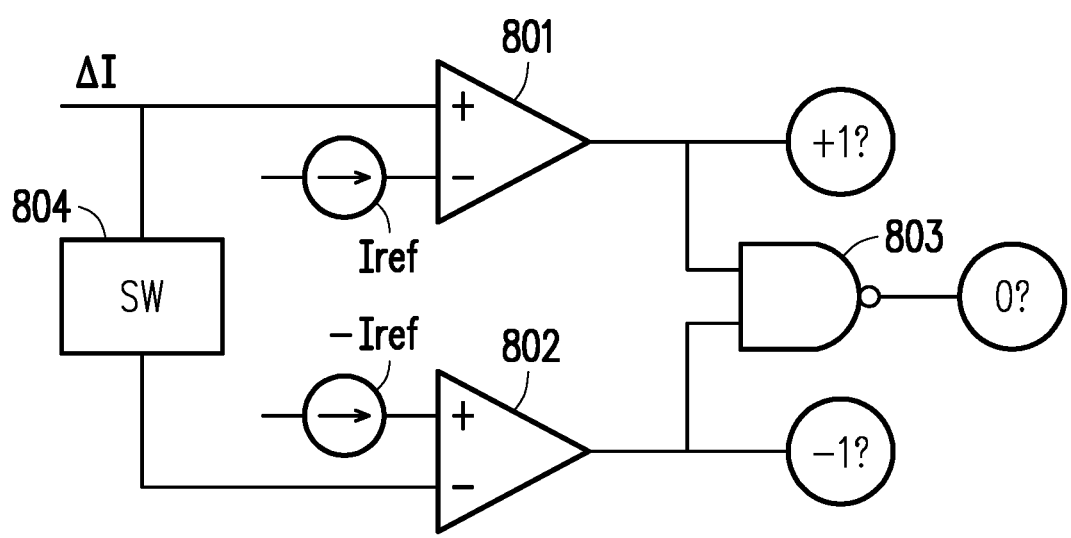
FIG. 8 illustrates a hardware diagram of the ternary weight detection circuit according to an exemplary embodiment of the disclosure.

The exemplary embodiment of the ternary weight detection circuit 800 (e.g. 206 506 706) is shown in FIG. 8. The ternary weight detection circuit 800 may include a first current comparator 801, a second current comparator 802, and a logic gate (e.g. NAND gate) 803. In response to receiving the differential current ΔI, the first current comparator 801 would compare ΔI with a reference current $I_{REF}$. If ΔI is greater than $I_{REF}$, then the output of the first current comparator 801 would be a high state which means the ternary weight is +1. If the output of the first current comparator 801 is in a low state, it means the ternary weight is not +1. In response to receiving the differential current ΔI, the second current comparator 802 would compare ΔI with a reference current $-I_{REF}$. If $-I_{REF}$ is greater than ΔI, then output of the first current comparator 801 would be a high state which means the ternary weight is -1. If the output of the second current comparator 802 is in a low state, it means the ternary weight is not -1. If both the output of the first current comparator 801 and the output of the second current comparator 802 are in the low state, then the output of the NAND gate would be in a high state. If the output of the NAND gate is in a high state, then the ternary weight is 0. If the output of the NAND gate is in a low state, then the ternary weight is not 0.

Figure 9:
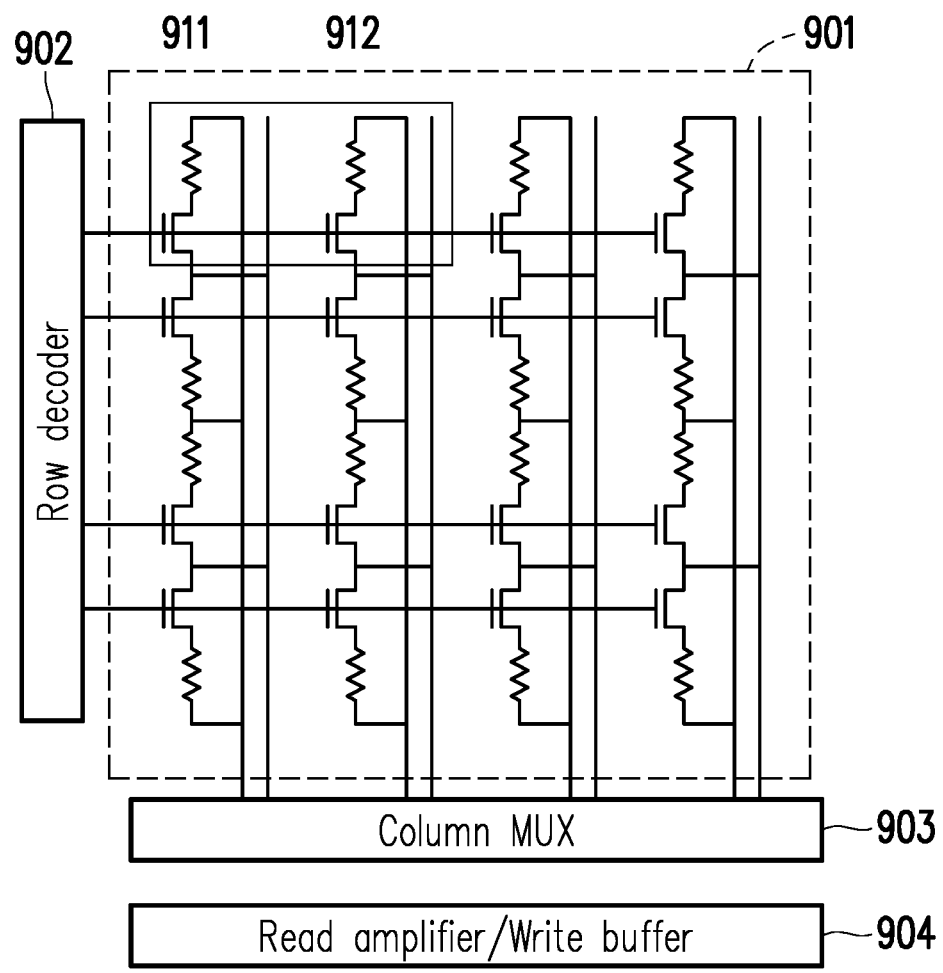
FIG. 9 illustrates the hardware diagram of a memory device for implementing a ternary weight for near memory computing according to a fifth exemplary embodiment of the disclosure.

FIG. 9 shows a hardware diagram of a memory device 900 for implementing a ternary weight per unit for near memory computing. The memory device 900 may include not limited to a plurality of memory cells 901 arranged in a matrix of a plurality of rows and columns, a row decoder 902 for activating a particular row, a column multiplexer 903 for selecting a column of bit lines, and a read amplifier and write buffer circuit 904. The plurality of memory cells 901 may include not limited to a first memory cell 911 and a second memory cell 912. The first memory cell 911 and the second memory cells 912 could be located in different columns but controlled by the same word line. Alternatively, the first memory cell 911 and the second memory cells 912 may also be located in the same columns but controlled by different word lines. The each of the memory cells of the plurality of memory cells 901 could be, for example, a resistive memory cell but the disclosure does not limit the memory cells to a particular type.

Within the plurality of memory cells 901, two of the memory cells such as the first memory cell 911 and the second memory cell 912 could be a dual-cell unit for implementing a ternary weight. For this exemplary embodiment, the combination of first resistor of the first memory cell 911 and the second resistor of the second memory cell 912 could be set or programmed to implement a ternary weight according to Table 1B below where the left cell could be the first memory cell 911 and the right cell could be the second memory cell 912. If the resistor of the right cell (e.g. 912) is set high (i.e. $R_H$) and the resistor in the left cell (e.g. 911) is set low (i.e. $R_L$), then the ternary weight would be +1, if the resistor of both the left cell (e.g. 911) and the right cell (e.g. 912) are above a threshold (i.e. "$R_{UH}$)", then the ternary weight would be +0, and if the resistor of the right cell (e.g. 912) is set low (i.e. $R_L$) and the resistor in the left cell (e.g. 911) is set high (i.e. $R_H$), then the ternary weight would be -1. A sense amplifier could be connected to the first memory cell 911 and the second memory cell 912 to read out the ternary weight, and the ternary weights of the plurality of memory cells 901 could be read out sequentially with N bits per cycle to obtain the weights of the neural network operation.

TABLE 1B

| Weight | Right Cell | Left Cell |
| --- | --- | --- |
| +1 | $R_H$ | $R_L$ |
| 0 | >$R_{UH}$ | >$R_{UH}$ |
| -1 | $R_L$ | $R_H$ |

Figure 10:
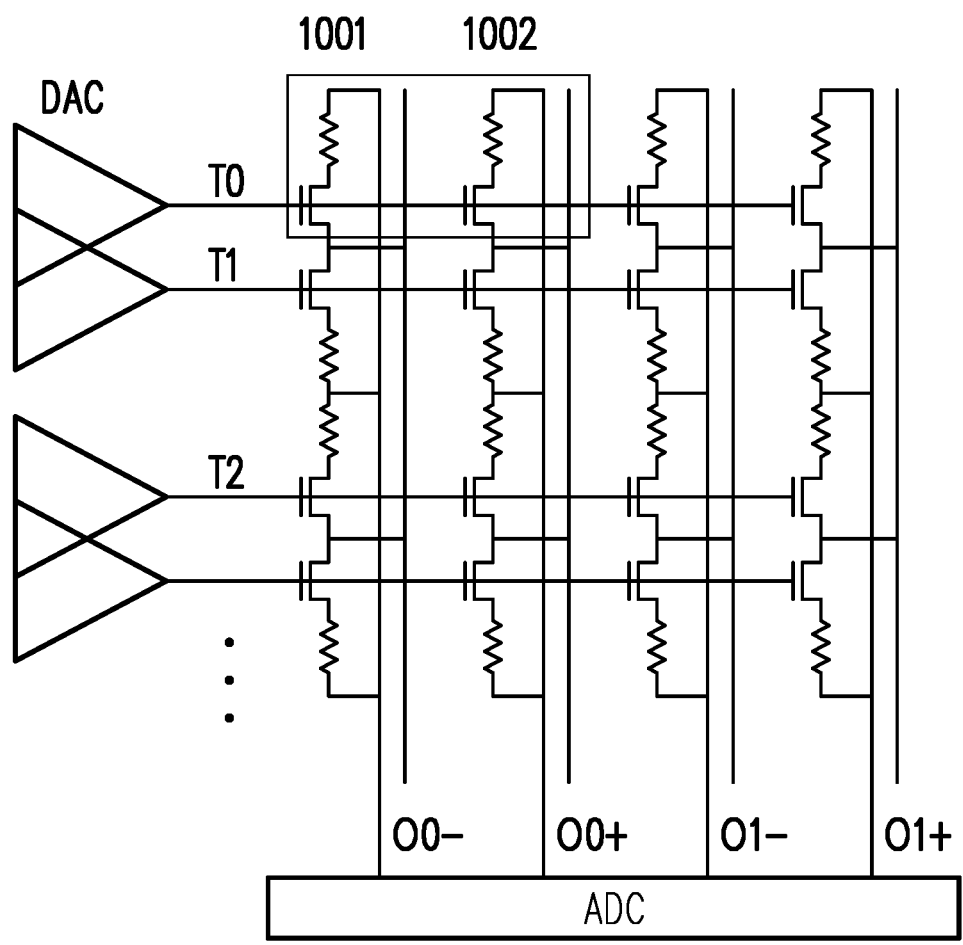
FIG. 10 illustrates the hardware diagram of a memory device for implementing a ternary weight for near memory computing according to a sixth exemplary embodiment of the disclosure.

FIG. 10 illustrates the hardware diagram of a memory device 1000 for implementing a ternary weight for in memory computing. Similar to the exemplary embodiment of FIG. 9, the memory device 1000 may include not limited to a plurality of memory cells arranged in a matrix of rows and columns. Each row of the memory device 1000 could be connected to a different output of an DAC while each column of the memory device could be connected to a different input of an ADC. Also similar to the exemplary embodiment of FIG. 9, two adjacent memory cells of the plurality of memory cells would form as a dual cell unit to implement one ternary weight. For example, the first memory cell 1001 and the second memory cells 1002 could be located in different columns but connected to the same word line as each word line is connected to a different output of the DAC. Alternatively, the first memory cell 1001 and the second memory cells 1002 may also be located in the same columns but controlled by different word lines. The each of the memory cells of the plurality of memory cells could be, for example, a resistive memory cell but the disclosure does not limit the memory cells to a particular type. For the example of FIG. 10, each DAC output would activate the word lines of each row, and two of the ADC inputs may represent a ternary weight. The ADC would convert the charges received by the ADC inputs into a digital value.

For example, the multiplication and accumulation (MAC) operation of neural network can be implemented by Pulse width (Ti) from DAC for input activation. The ternary weight at i$^{th}$ row and j$^{th}$ column could be represented $$W_{ij} = \frac{Vbl}{R_{ij}(+)} - \frac{Vbl}{R_{ij}(-)}$$

where, Vbl is a constant voltage on bit-line and R$_{ij}$(+) & R$_{ij}$(−) are the two resistance values configured in the dual-cell unit (e.g. 1001 1002) on i$^{th}$ row and j$^{th}$ column. The MAC operation could be represented by $$O_j = \sum T_i \times \frac{Vbl}{R_{ij}(+)} - \frac{Vbl}{R_{ij}(-)}$$

where Oj is the current on each of the bit lines. Table 2 shows the correspondence between the current Oj and the ternary weight. The ADC will convert the analog values Oj into digital numbers for subsequent operations.

TABLE 2

| Weight | Right Cell | Left Cell | Weight (in current) |
|--------|-----------|-----------|---------------------|
| +1 | $R_H$ | $R_L$ | $=(V_{bl}/RL - V_{bl}/R_H) > 0$ |
| 0 | $>R_{UH}$ | $>R_{UH}$ | $=(V_{bl}/RL - V_{bl}/R_H) \sim 0$ |
| −1 | $R_L$ | $R_H$ | $=(V_{bl}/RL - V_{bl}/R_H) < 0$ |

In summary the disclosure is directed to a memory circuit, an electronic device, and a method for implementing a ternary weight for in-memory computing. According to an aspect of the disclosure, the disclosure provides a memory circuit which includes a first memory cell comprising a first resistor, a second memory cell a second resistor, a write driver configured to set the first resistor to a first resistance value, a second write driver configured to set the second resistor to a second resistance value, and a ternary weight detector configured to determine a ternary weight which is selected among a first ternary weight, a second ternary weight, and a third ternary weight based on the first resistance value and the second resistance value.

According to various exemplary embodiments, the first resistance value could be set to a low value and the second resistance value could be set to a high value for the first ternary weight, the first resistance value could be set to the high value and the second resistance value could be set to the high value for the second ternary weight, and the first resistance value could be set to the high value and the second resistance value could be set to the low value for the third ternary weight. The low value could be any positive resistance value below a low resistance threshold, and the high value could be any positive resistance value above a high resistance threshold. The first ternary weight could be +1, the second ternary weight could be 0, and the third ternary weight could be −1. The ternary weight detector may include a differential current detector configured to output a differential current according to a summation of a first current of the first BL and a second current of the second BL. The differential current detector could be configured to determine the differential current as corresponding to the first ternary weight when the differential current is above a positive current threshold, the differential current detector could be configured to determine the differential current as corresponding to the second ternary weight when the differential current is between the positive current threshold and a negative current threshold, and the differential current detector is configured to determine the differential current as corresponding to the third ternary weight when the differential current is below the negative current threshold. The differential current detector could be configured to detect the differential current based on a current difference between a first ratio of a voltage of the WL and the first resistance and a second ratio of the voltage of the WL and the second resistance. The differential current detector could be a sense amplifier receiving the current difference which is compared against a reference current to determine the ternary weight. The first memory cell could be connected to a first BL, the second memory cell is connected to a second BL, and the first memory cell and the same memory cell are connected to the same WL. Alternatively, the first memory cell and the second memory cell could be connected to the same BL, the first memory cell is connected to a first WL, and the second memory cell is connected to a second WL.

According to an aspect of the disclosure, the disclosure is directed to an electronic device which includes a CPU, a memory controller coupled to the CPU, and a memory circuit coupled to the memory controller and includes a first memory cell having a first resistor, a second memory cell having a second resistor, a write driver configured to set the first resistor to a first resistance value, a second write driver configured to set the second resistor to a second resistance value, and a ternary weight detector configured to determine a ternary weight which is selected among a first ternary weight, a second ternary weight, and a third ternary weight based on the first resistance value and the second resistance value. The first resistance value is to be set to a low value and the second resistance value is to be set to a high value for the first ternary weight, the first resistance value is to be set to the high value and the second resistance value is to be set to the high value for the second ternary weight, and the first resistance value is to be set to the high value and the second resistance value is to be set to the low value for the third ternary weight.

According to various exemplary embodiments, the low value could be any positive resistance value below a low resistance threshold and the high value could be any positive resistance value above a high resistance threshold. The first ternary weight could be +1, the second ternary weight could be 0, and the third ternary weight could be −1. The ternary weight detector may include a differential current detector configured to output a differential current according to a summation of a first current of the first BL and a second current of the second BL and could be configured to determine the differential current as corresponding to the first ternary weight when the differential current is above a positive current threshold, the current detector could be configured to determine the differential current as corresponding to the second ternary weight when the differential current is between the positive current threshold and a negative current threshold, and the current detector could be configured to determine the differential current as corresponding to the third ternary weight when the differential current is below the negative current threshold. The first memory cell could be connected to a first BL, the second memory cell could be connected to a second BL, and the first memory cell and the same memory cell are connected to the same WL. Alternatively, the first memory cell and the second memory cell are connected to the same BL, the first memory cell is connected to a first WL, and the second memory cell is connected to a second WL.

According to an aspect of the disclosure, the disclosure is directed to a method of determining a ternary weight selected from a first ternary weight, a second ternary weight, and a third ternary weight used by a memory circuit which includes a first memory cell having a first resistor and a second memory cell having a second resistor. The method would include setting first resistor to a first resistance value and a second resistor to a second resistance value, wherein the first resistance value is a low value and the second resistance is a high value for the first ternary weight, first resistance value is the high value and the second resistance is the high value for the second ternary weight, and first resistance value is the high value and the second resistance is the low value for the third ternary weight, generating a differential current according to a current difference between a first ratio of a BL voltage and the first resistance value and a second ratio of the BL voltage and the second resistance value, and using a differential current detector for outputting the ternary weight.

According to various exemplary embodiment, the method may further include generating the differential current having a positive value for the first ternary weight, generating the differential current having a zero value for the second ternary weight, and generating the differential current having a negative value for the third ternary weight so as to generate a differential current according to a current difference between a first ratio of a BL voltage and the first resistance value and a second ratio of the BL voltage and the second resistance value. The first ternary weight could be +1, the second ternary weight could be 0, and the third ternary weight could be −1. The low value could be any positive resistance value below a low resistance threshold, and the high value could be any positive resistance value above a high resistance threshold.

In view of the aforementioned descriptions, the present disclosure is suitable for being used in a memory circuit and is able to implement ternary weight for a CNN or DNN in an analog manner resulting in a faster computational speed so as to improve the field of in-memory computing.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of" multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A memory circuit comprising:
   a first memory cell comprising a first resistor;
   a second memory cell comprising a second resistor;
   a first write driver configured to set the first resistor to a first resistance value;
   a second write driver configured to set the second resistor to a second resistance value;
   a differential current sensing circuit configured to determine a differential current between the first memory cell and the second memory cell based on the first resistance value and the second resistance value; and
   a ternary weight detector configured to determine a ternary weight which is selected among a first ternary weight, a second ternary weight, and a third ternary weight based on the differential current.

2. The memory circuit of claim 1, wherein the first resistance value is to be set to a low value and the second resistance value is to be set to a high value for the first ternary weight, the first resistance value is to be set to the high value and the second resistance value is to be set to the high value for the second ternary weight, and the first resistance value is to be set to the high value and the second resistance value is to be set to the low value for the third ternary weight.

3. The memory circuit of claim 1, wherein the low value is any positive resistance value below a low resistance threshold, and the high value is any positive resistance value above a high resistance threshold.

4. The memory circuit of claim 1, wherein the first ternary weight is +1, the second ternary weight is 0, and the third ternary weight is −1.

5. The memory circuit of claim 1, wherein the differential current sensing circuit is configured to output a differential current according to a summation of a first current from the first memory cell and a second current from the second memory cell.

6. The memory circuit of claim 5, wherein the ternary weight detecting circuit is configured to determine the differential current as corresponding to the first ternary weight when the differential current is above a positive current threshold, to determine the differential current as corresponding to the second ternary weight when the differential current is between the positive current threshold and a negative current threshold, and is configured to determine the differential current as corresponding to the third ternary weight when the differential current is below the negative current threshold.

7. The memory circuit of claim 4, wherein the differential current sensing circuit is configured to detect the differential current based on a current difference between a first ratio of a voltage of the WL and the first resistance and a second ratio of the voltage of the WL and the second resistance.

8. The memory circuit of claim 7, wherein the ternary weight detecting circuit comprises a current comparator circuit which compares the differential current with a reference current to determine the ternary weight.

9. The memory circuit of claim 1, wherein the first memory cell is connected to a first bit line (BL), the second memory cell is connected to a second BL, and the first memory cell and the second memory cell are connected to the same word line (WL).

10. The memory circuit of claim 1, wherein the first memory cell and the second memory cell are connected to the same bit line (BL), the first memory cell is connected to a first word line (WL), and the second memory cell is connected to a second WL.

11. An electronic device comprising:
   a central processor (CPU);
   a memory controller coupled to the CPU; and
   a memory circuit coupled to the memory controller and comprising:
      a first memory cell comprising a first resistor;

a second memory cell comprising a second resistor;

a first write driver configured to set the first resistor to a first resistance value;

a second write driver configured to set the second resistor to a second resistance value;

a differential current sensing circuit configured to determine a differential current between the first memory cell and the second memory cell based on the first resistance value and the second resistance value; and a ternary weight detector configured to determine a ternary weight which is selected among a first ternary weight, a second ternary weight, and a third ternary weight based on the differential current, wherein the first resistance value is to be set to a low value and the second resistance value is to be set to a high value for the first ternary weight, the first resistance value is to be set to the high value and the second resistance value is to be set to the high value for the second ternary weight, and the first resistance value is to be set to the high value and the second resistance value is to be set to the low value for the third ternary weight.

12. The electronic device of claim 11, wherein the low value is any positive resistance value below a low resistance threshold, and the high value is any positive resistance value above a high resistance threshold.

13. The electronic device of claim 11, wherein the first ternary weight is +1, the second ternary weight is 0, and the third ternary weight is −1.

14. The electronic device of claim 11, wherein the differential current sensing circuit is configured to output a differential current according to a summation of a first current from the first memory cell and a second current from the second memory cell and is configured to determine the differential current as corresponding to the first ternary weight when the differential current is above a positive current threshold, the current detector is configured to determine the differential current as corresponding to the second ternary weight when the differential current is between the positive current threshold and a negative current threshold, and the current detector is configured to determine the differential current as corresponding to the third ternary weight when the differential current is below the negative current threshold.

15. The electronic device of claim 11, wherein the first memory cell is connected to a first bit line (BL), the second memory cell is connected to a second BL, and the first memory cell and the second memory cell are connected to the same word line (WL).

16. The electronic device of claim 11, wherein the first memory cell and the second memory cell are connected to the same bit line (BL), the first memory cell is connected to a first word line (WL), and the second memory cell is connected to a second WL.

17. A method used by a memory circuit comprising a first memory cell having a first resistor and a second memory cell having a second resistor for determining a ternary weight selected from a first ternary weight, a second ternary weight, and a third ternary weight, the method comprising:

setting first resistor to a first resistance value and a second resistor to a second resistance value, wherein the first resistance value is a low value and the second resistance is a high value for the first ternary weight, first resistance value is the high value and the second resistance is the high value for the second ternary weight, and first resistance value is the high value and the second resistance is the low value for the third ternary weight;

generating a differential current according to a current difference between a first ratio of a BL voltage and the first resistance value and a second ratio of the BL voltage and the second resistance value; and determining the ternary weight based on the differential current.

18. The method of claim 16, wherein generating the differential current according to the difference between the first ratio of the BL voltage and the first resistance value and the second ratio of the BL voltage and the second resistance value further comprising:

generating the differential current having a positive value for the first ternary weight;

generating the differential current having a zero value for the second ternary weight; and generating the differential current having a negative value for the third ternary weight.

19. The method of claim 16, wherein the first ternary weight is +1, the second ternary weight is 0, and the third ternary weight is −1.

20. The method of claim 16, wherein the low value is any positive resistance value below a low resistance threshold, and the high value is any positive resistance value above a high resistance threshold.

* * * * *